US008472491B2

United States Patent
Kawaguchi

(10) Patent No.: US 8,472,491 B2
(45) Date of Patent: Jun. 25, 2013

(54) SEMICONDUCTOR LASER DEVICE

(75) Inventor: Masao Kawaguchi, Osaka (JP)

(73) Assignee: Panasonic Corporation, Osaka (JP)

(*) Notice: Subject to any disclaimer, the term of this patent is extended or adjusted under 35 U.S.C. 154(b) by 244 days.

(21) Appl. No.: 12/742,573

(22) PCT Filed: Oct. 16, 2009

(86) PCT No.: PCT/JP2009/005403
§ 371 (c)(1),
(2), (4) Date: May 12, 2010

(87) PCT Pub. No.: WO2010/079541
PCT Pub. Date: Jul. 15, 2010

(65) Prior Publication Data
US 2011/0051770 A1    Mar. 3, 2011

(30) Foreign Application Priority Data
Jan. 6, 2009   (JP) ................. 2009-000621

(51) Int. Cl.
*H01S 3/22*    (2006.01)
*H01S 5/24*    (2006.01)

(52) U.S. Cl.
USPC .............. 372/46.012; 372/44.011; 372/44.01; 372/43.01

(58) Field of Classification Search
USPC .................. 372/46.012, 43.01, 44.01, 44.011
See application file for complete search history.

(56) References Cited

U.S. PATENT DOCUMENTS

| 2005/0141577 | A1 | 6/2005 | Ueta et al. |
| 2006/0086948 | A1 | 4/2006 | Ohno et al. |
| 2009/0316744 | A1 | 12/2009 | Obata |

FOREIGN PATENT DOCUMENTS

| JP | 2003179331 | * | 6/2003 |
| JP | 2003-234544 | | 8/2003 |
| JP | 2004-327655 | | 11/2004 |
| JP | 2006128661 A | * | 5/2006 |
| JP | 3816942 | | 8/2006 |
| JP | 2008159635 | * | 7/2008 |
| JP | 2008-198743 | | 8/2008 |

OTHER PUBLICATIONS

Nakijima, JP2003179331, translation, Publication date Jun. 2003.*

* cited by examiner

*Primary Examiner* — Jessica Stultz
*Assistant Examiner* — Michael Carter
(74) *Attorney, Agent, or Firm* — McDermott Will & Emery LLP

(57) ABSTRACT

A semiconductor laser device includes a semiconductor-layer lamination (20) having an active layer (26) formed over a substrate (11). The semiconductor-layer lamination (20) includes a front face which emits light, a strip-shaped optical waveguide formed in a direction transverse to the front face, a first region (20A) extending in a direction transverse to the front face, a second region (20B) having a top surface whose height is different from that of the first region (20A), and a planar region (20C) formed between the first region (20A) and the second region (20B), and having periodic surface undulations whose variation is smaller than that of the second region (20B). The optical waveguide is formed in the planar region (20C).

14 Claims, 5 Drawing Sheets (a)

(b)

SEMICONDUCTOR LASER DEVICE

RELATED APPLICATIONS

This application is the U.S. National Phase under 35 U.S.C. §371 of International Application No. PCT/JP2009/005403, filed on Oct. 16, 2009, which in turn claims the benefit of Japanese Application No. 2009-000621, filed on Jan. 6, 2009, the disclosures of which Applications are incorporated by reference herein.

TECHNICAL FIELD

The present disclosure relates to semiconductor laser devices, and more particularly to semiconductor laser devices using nitride semiconductor.

BACKGROUND ART

Due to the compact size, low prices, high power, etc., semiconductor laser devices are used in diverse technical fields including IT technologies, such as communication and optical disks, as well as medicine, illumination, etc. In recent years, among others, development of gallium nitride (GaN)-based semiconductor laser devices having a wavelength of 405 nm for the Blu-ray Disc format is actively underway. Development of pure-blue laser devices using GaN-based semiconductor and having a wavelength of 450 nm-470 nm used for laser displays, backlights in liquid crystal displays, etc., is also underway.

If the shape of radiation beam has multiple peaks, a write operation to an unintended location etc. may occur in disk applications. In addition, in display and backlight applications, the optical system to shape emitted laser light becomes complex, which may result in a cost increase. As such, an output-beam shape whose far-field pattern (FFP) is single peaked is required of GaN-based semiconductor laser devices.

If the planarity of the optical waveguide is low, and there are surface undulations having a period to cause scattering of the laser light guided in the optical waveguide, a part of the laser light subjected to scattering is absorbed in the resonator. In addition, a part of the scattered laser light is emitted to the substrate side. Since scattering causes optical loss, the efficiency of the laser device is reduced. The light emitted to the substrate side is guided in a mode called "substrate mode" which is different from an expected guided mode. If this light is emitted to the outside, a ripple is caused to appear in the FFP of the output beam, and thus the single-peaked nature is degraded. Therefore, in order to achieve a semiconductor laser device having a single-peaked FFP, planarization of the optical waveguide becomes important.

Meanwhile, in a GaN-based semiconductor laser, efficiency improvement (power enhancement) is demanded for high-speed write operation and multilayer recording for disk applications. In addition, in display and backlight applications, efficiency improvement (power enhancement) is demanded for brightness enhancement.

If the Eg of an active layer is not constant but varies in an optical gain range of the resonator, the effective volume of the active layer contributing to the generation of laser light decreases. A decrease of the volume of the active layer reduces the gain of the active layer, thereby reducing the efficiency of the laser device. Therefore, in order to achieve a high-efficiency semiconductor laser device, the bandgap energy (Eg) of the active layer needs to be kept sufficiently uniform in the optical gain range.

A method to control an off-angle of the substrate in order to planarize an optical waveguide has been known (see, e.g., Patent Document 1.). For example, a change of an off-angle of the substrate from 0.2° to 1.0° allows planarization of a semiconductor layer formed over the substrate, thereby allowing planarization of the optical waveguide.

CITATION LIST

Patent Document

PATENT DOCUMENT 1: Specification of Japanese Patent Publication No. P3816942

SUMMARY OF THE INVENTION

Technical Problem

The present inventor has recognized that control of an off-angle of the substrate not only allows the planarity of the surface of a laminated structure to be improved, but also allows variation in the Eg of an active layer to be reduced. However, a problem exists in that if the optical waveguide is planarized and the Eg of the active layer is made uniform by introducing an off-angle to the substrate, the cost of the substrate increases. In addition, since a distribution of an off-angle exists on the plane of the substrate, only a particular part of the substrate can be used. Accordingly, the number of semiconductor laser devices which can be obtained from one wafer is significantly reduced.

It is an object of the present disclosure to solve the above problems, and thus to achieve a semiconductor laser device having a planarized optical waveguide and an active layer whose bandgap energy is uniform without control of the off-angle of the substrate.

Solution to the Problem

In order to achieve the above objective, an example semiconductor laser device is configured such that semiconductor layers are formed over a stepped region, and an optical waveguide is formed over a planar region in the vicinity of the stepped region.

Specifically, the example semiconductor laser device includes a semiconductor-layer lamination having an active layer formed over a substrate; the semiconductor-layer lamination has a front face which emits light, a strip-shaped optical waveguide formed in a direction transverse to the front face, a first region extending in a direction transverse to the front face, a second region having a top surface whose height is different from that of the first region, and a planar region formed between the first and the second regions, and having periodic surface undulations whose variation is smaller than that of the second region; and the optical waveguide is formed in the planar region.

Since the example semiconductor laser device includes an optical waveguide formed in a planar region, the planarity of the optical waveguide can be improved. Therefore, a ripple is less likely to appear in the far-field pattern (FFP) of the laser beam, and thus an FFP closer to a single-peaked pattern can be achieved. In addition, since variation in the bandgap energy of the active layer can be reduced, the efficiency of a semiconductor laser device can be improved.

In the example semiconductor laser device, it is preferable to have a configuration such that the planar region has a height variation smaller than that of the second region in the direction transverse to the front face.

In the example semiconductor laser device, it may be configured such that the semiconductor-layer lamination includes a strip-shaped ridge portion formed in the direction transverse to the front face, and the ridge portion is formed in the planar region.

In the example semiconductor laser device, it may be configured such that the substrate includes two sections having top surfaces whose heights are different from each other, where the first region is formed over one of the two sections, and the second region is formed over the other one of the two sections.

In this regard, the one of the two sections may be a trench, and the first region may be formed over the trench; alternatively, the one of the two sections may be a strip-shaped projection, and the first region may be formed over the projection.

In the example semiconductor laser device, it is preferable that a distance between the border of the two sections and the ridge portion be greater than or equal to 1 μm and less than or equal to 15 μm.

In the example semiconductor laser device, it is preferable to have a configuration such that a portion in the active layer formed under the ridge portion has a variation in the bandgap energy smaller than that of the other part of the active layer.

In the example semiconductor laser device, it is preferable to have a configuration such that a top surface of a region where the optical waveguide is formed in the semiconductor-layer lamination has a root-mean-square roughness less than or equal to 20 nm.

In the example semiconductor laser device, it is preferable to have a configuration such that the semiconductor-layer lamination is made of nitride semiconductor, and the optical waveguide is formed in a direction along an m-axis of the nitride semiconductor.

In the example semiconductor laser device, it may be configured such that the active layer includes indium.

In the example semiconductor laser device, it is preferable that the planar region be formed continuously from the front face to a rear face opposite the front face.

Advantages of the Invention

According to the example semiconductor laser device, a semiconductor laser device having a planarized optical waveguide and an active layer whose bandgap energy is uniform can be achieved without control of the off-angle of the substrate.

BRIEF DESCRIPTION OF THE DRAWINGS

FIG. 2A is a graph taken along line IIa-IIa of FIG. 1, and FIG. 2B is a graph taken along line IIb-IIb of FIG. 1.

FIG. 5A is a plan view, FIG. 5B is a cross-sectional view taken along line Vb-Vb of FIG. 5A, and FIG. 5C is a cross-sectional view taken at an end face of the resonator.

DESCRIPTION OF EMBODIMENTS

Figure 1:
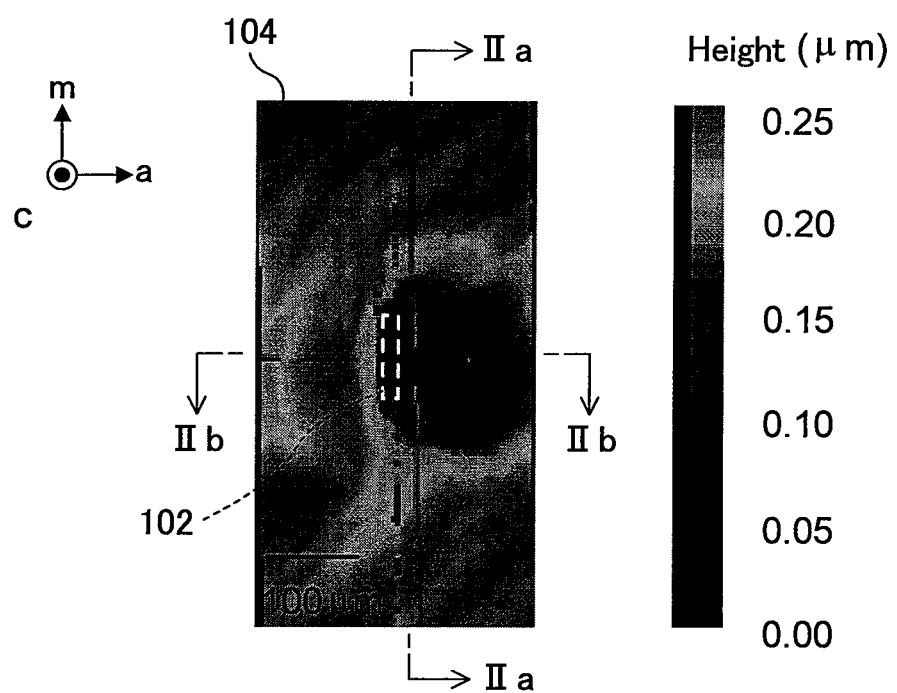
FIG. 1 shows a result of measuring surface geometry of a semiconductor layer formed over a substrate having a trench.

First, a method found by the present inventor to planarize an optical waveguide formed over a substrate and to make the bandgap energy of an active layer uniform will be described with reference to the drawings. FIG. 1 shows a result of measuring surface geometry of a nitride semiconductor layer 104 grown over a substrate having a trench 102 using a laser-interferometer coordinate measuring machine (PTI 250 from Zygo Corporation). The crystal plane orientations of hexagonal GaN-based crystal are denoted by the symbols of c, a, and m in each figure. "C" denotes a plane equivalent to the plane (0001) and its normal vector, c-axis. "A" denotes a plane equivalent to the plane (11-20) and its normal vector, a-axis. "M" denotes a plane equivalent to the plane (1-100) and its normal vector, m-axis. For purposes herein, the negative sign "–" added to a Miller index for a crystal plane orientation expediently represents an inversion of one integer following the negative sign.

Figure 2:
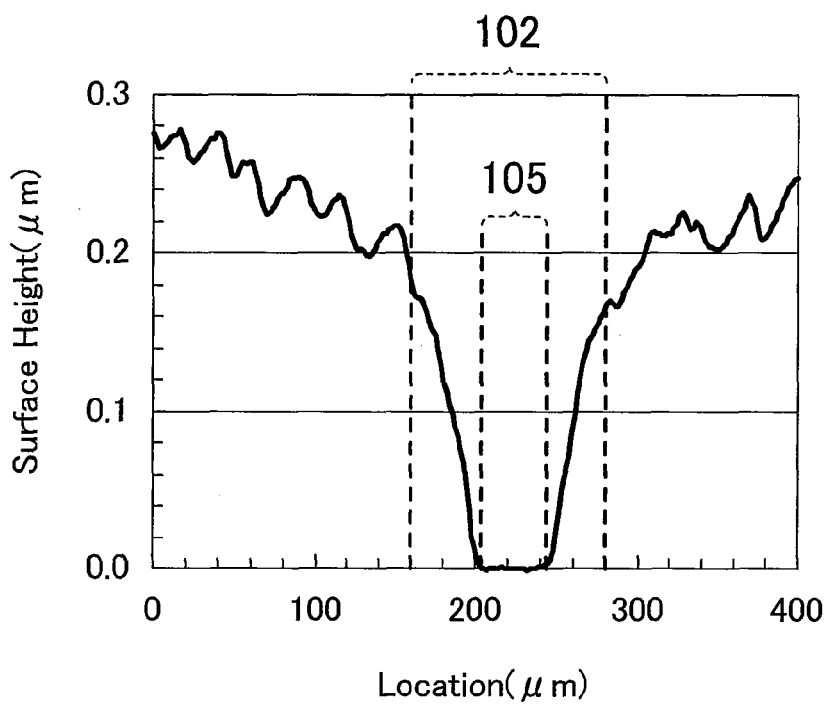
FIGS. 2A-2B are graphs providing numerical values in association with the surface geometry of the semiconductor layer shown in FIG. 1.
Figure 2:
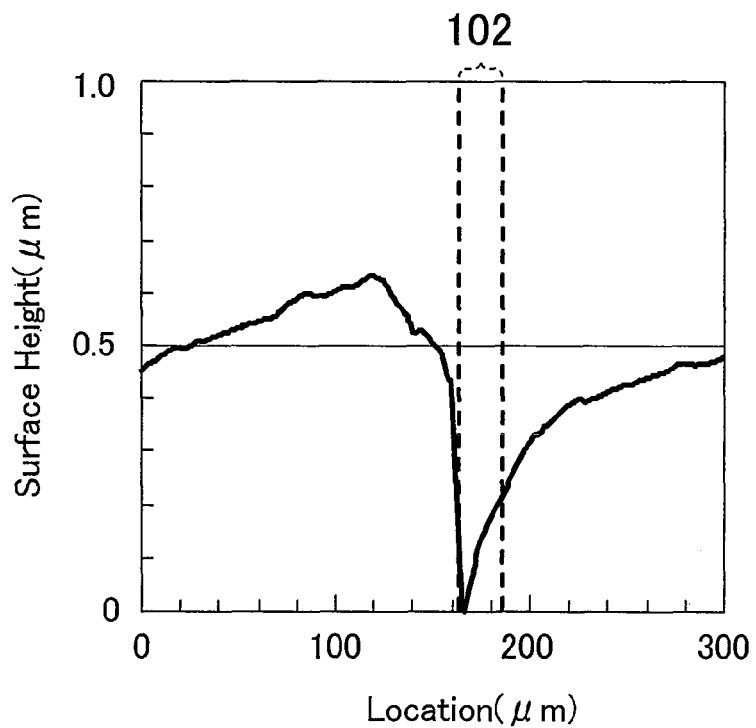

As shown in FIG. 1, a nitride semiconductor layer 104 having a thickness of 2 μm is formed over a substrate on which a trench 102 having a length along the m-axis direction of 100 μm, a width along the a-axis direction of 20 μm, and a depth along the c-axis direction of 2 μm is formed. The nitride semiconductor layer 104 has a recess reflecting the geometry of the trench 102. FIGS. 2A-2B illustrate the results of more detailed study on the geometry of the recess. FIGS. 2A-2B illustrate height variations of the nitride semiconductor layer 104 taken along line IIa-IIa and line IIb-IIb of FIG. 1, respectively. In FIGS. 2A-2B, the height of the nitride semiconductor layer 104 is illustrated on a relative scale in which the height of the lowest portion is shown as "0." In addition, FIG. 2A illustrates a value measured at a location 5 μm from an end of the trench 102.

As shown in FIG. 2A, when viewing the cross-section of the recess along the m-axis direction, a portion of the nitride semiconductor layer 104 which is formed laterally adjacent to the trench 102 has a height less than the other part by approximately 0.2 μm. In addition, a periodic height variation is observed in a portion formed in the region other than the region laterally adjacent to the trench 102. The magnitude of the variation is approximately 0.02 μm-0.04 μm, and the period of the variation is approximately 20 μm-25 μm. Meanwhile, in the portion formed laterally adjacent to the trench 102, a planar region 105 exists where almost no such periodic height variations are observed. The planar region 105 has a height difference of almost zero along the m-axis direction, and has a height variation smaller than that of the region other than the planar region 105. Measurement of the root-mean-square (RMS) roughness has yielded a value less than or equal to 10 nm.

As shown in FIG. 2B, when viewing the cross-section of the recess along the a-axis direction, at a location approximately 5 μm from an end of the trench 102, there is a slope where the height of the nitride semiconductor layer 104 increases by about 0.1 µm per 20 µm. In FIG. 2B, a laterally adjacent portion on one side of the trench 102 has a steep slope, while a laterally adjacent portion on the other side has a gentle slope, which is due to anisotropy of the crystal of the nitride semiconductor layer 104. That is, the planar region 105, whose height changes in the a-axis direction, but is almost unchanged in the m-axis direction, is formed laterally adjacent to the trench 102 in the a-axis direction, parallel to the trench 102.

If an optical waveguide along the m-axis direction is formed in the planar region 105, which is formed laterally adjacent to the trench 102 in the a-axis direction, and whose height is almost unchanged in the m-axis direction, a very planar optical waveguide can be achieved. This achieves a semiconductor laser device having a single-peaked FFP shape.

Although the planar region 105 has a slope in the a-axis direction, the width of the ridge portion in the a-axis direction is normally about 1 µm-2 µm. Therefore, the height change in the ridge portion in the a-axis direction is a monotone change of about 0.01 µm, and thus the slope in the a-axis direction creates no problems. In addition, the planar region is not always formed only on a portion having a slope in the a-axis direction, but depending on the formation condition of the semiconductor layer, a planar region 105 having little slope in the a-axis direction can also be formed.

In FIG. 2A, the length of the planar region 105 in the m-axis direction is about 40 µm. However, the length of the planar region 105 depends on the length of the trench 102. Therefore, increasing the length of the trench 102 allows the length of the planar region 105 to be increased, and thus a semiconductor laser device having a long resonator length can also be easily formed.

Figure 3:
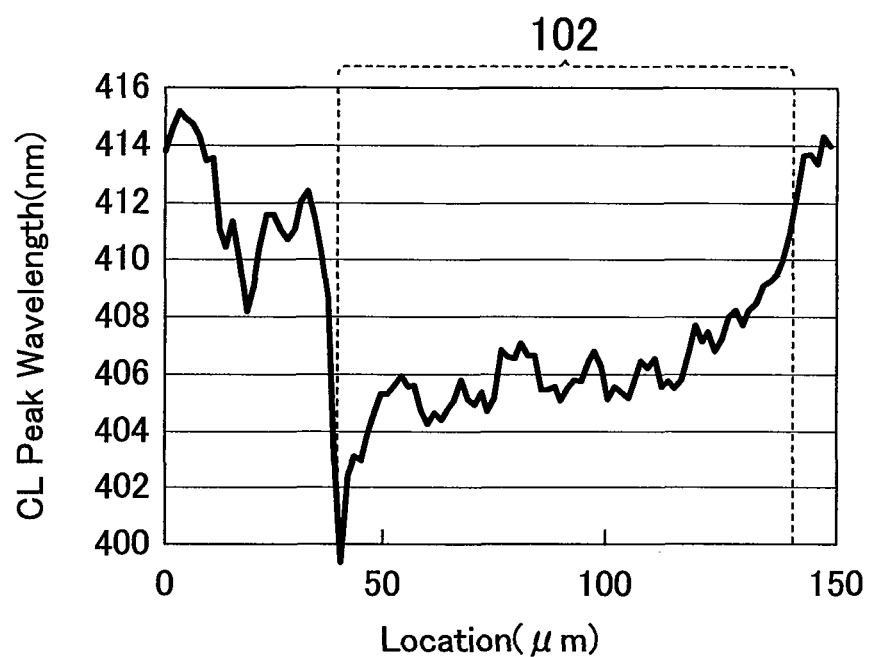
FIG. 3 shows a result of measurement of the emission wavelength of cathode luminescence in the vicinity of the trench in the active layer formed over the substrate having a trench.
Figure 4:
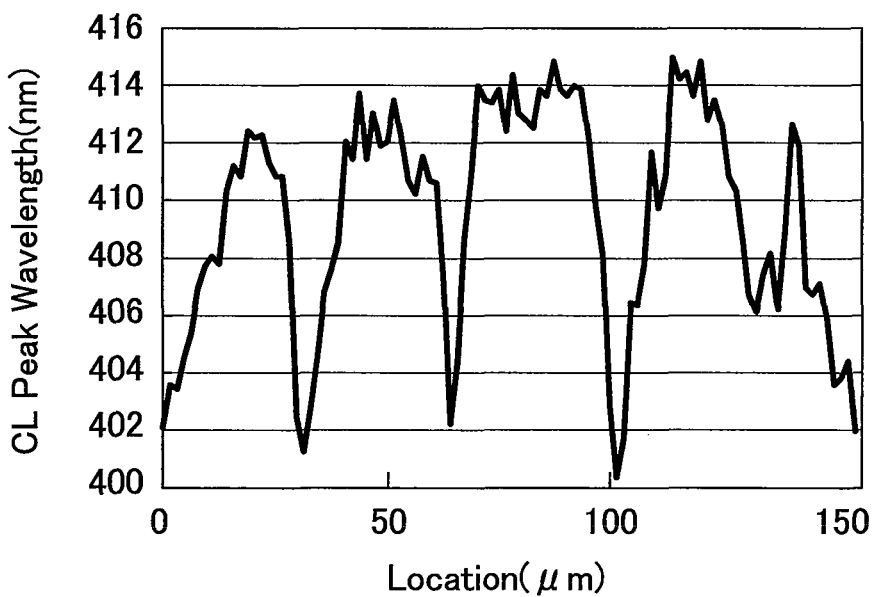
FIG. 4 shows a result of measurement of the emission wavelength of cathode luminescence in a portion apart from the trench in the active layer formed over the substrate having a trench.

FIGS. 3 and 4 show results of measurements of an emission peak wavelength of cathode luminescence (CL), which is an index for the bandgap energy of an active layer, using the nitride semiconductor layer 104 as the active layer. Measurement of CL is performed along a line parallel to the m-axis direction; FIG. 3 shows a result of measurement performed along a line passing through a location 5 µm from an end of the trench 102 in the a-axis direction, and FIG. 4 shows a result of measurement performed along a line passing through a location more than or equal to 100 µm from an end of the trench 102 in the a-axis direction.

As shown in FIG. 4, in a region sufficiently spaced from the trench 102, the emission peak wavelength of CL varies periodically. The magnitude of the variation is approximately 10 nm, and the period of the variation is approximately 25 µm. Meanwhile, as shown in FIG. 3, at a location about 5 µm from the trench 102 in the a-axis direction, there is a region where the variation in the emission peak wavelength of CL is smaller than that of the other region. Specifically, the variation in the emission peak wavelength of CL is less than or equal to 4 nm in the 50 µm-130 µm region. This region almost coincides with the planar region shown in FIG. 2A in which almost no periodic surface undulations are observed. Therefore, by forming an optical waveguide in the planar region 105 shown in FIG. 2A, not only an optical waveguide with a high degree of planarity can be achieved, but also variation in the bandgap energy of the active layer can be reduced to a small amount.

The configuration of a semiconductor laser device will be described in more detail in relation to the following embodiment.

One Embodiment

Figure 5:
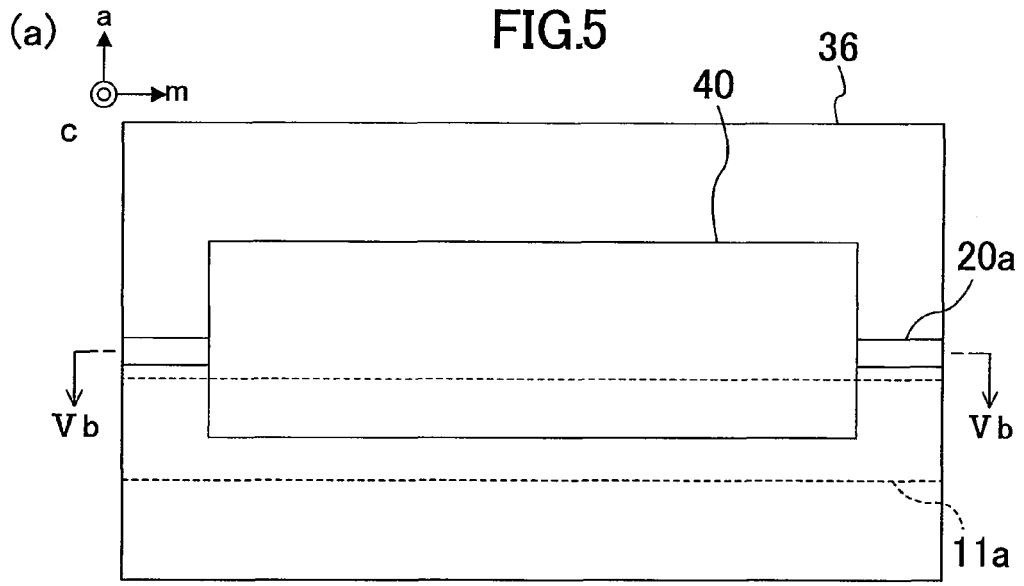
FIGS. 5A-5C illustrate a semiconductor laser device according to one embodiment.
Figure 5:
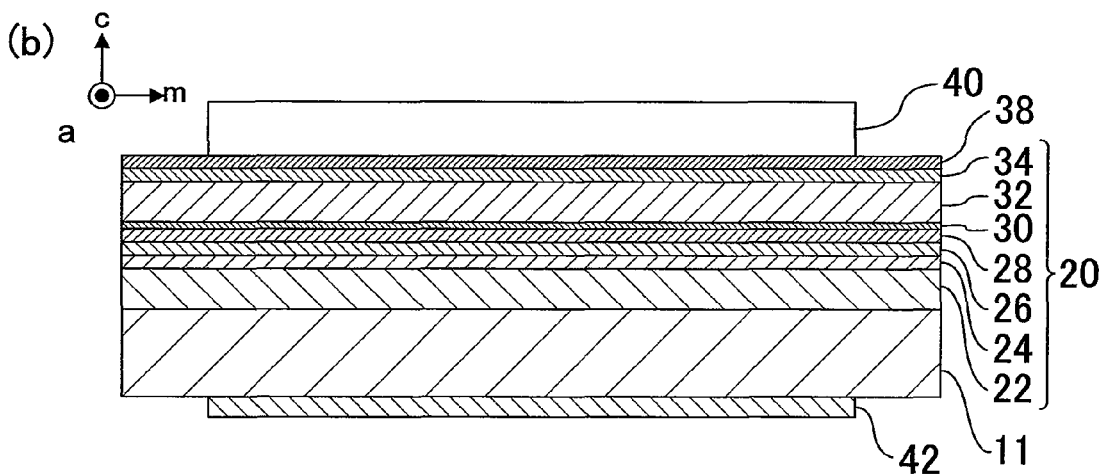
Figure 5:
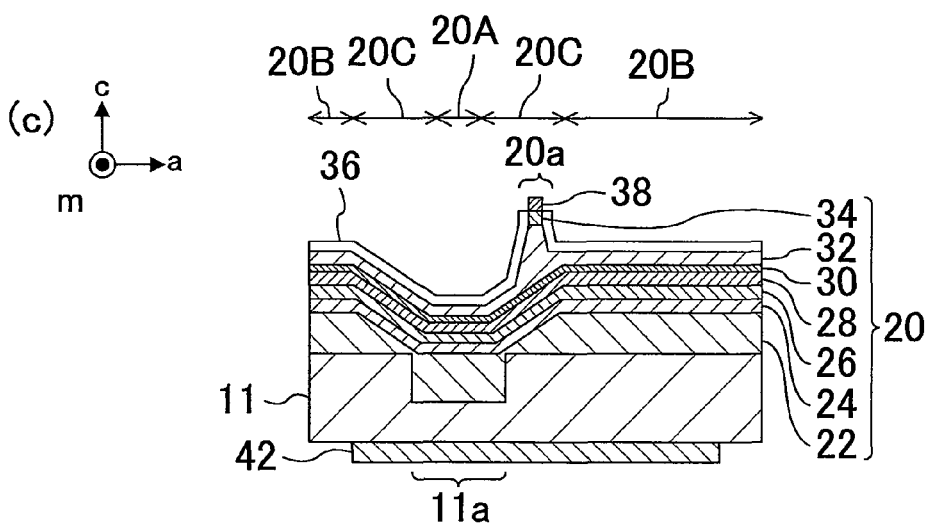

FIGS. 5A-5C illustrate a semiconductor laser device according to one embodiment; FIG. 5A illustrates a planar configuration, FIG. 5B illustrates a cross-sectional configuration taken along line Vb-Vb of FIG. 5A, and FIG. 5C illustrates a cross-sectional configuration taken at an end face of the resonator.

As shown in FIGS. 5A-5C, a semiconductor laser device according to this embodiment includes a semiconductor-layer lamination 20 formed over a substrate 11 having a trench 11a extending in an m-axis direction. N-type hexagonal GaN whose principal plane is the plane (0001) etc. can be used for the substrate 11. The trench IIa can be formed as follows, for example. After depositing an $SiO_2$ film having a thickness of 0.6 µm over the substrate 11 by a thermal chemical vapor deposition (CVD) technique using $SiH_4$ etc., the $SiO_2$ film is selectively removed by photolithography, thereby forming a strip-shaped opening along the m-axis direction. Then, by an inductively coupled plasma (ICP) etching tool using carbon tetrafluoride ($CF_4$), the exposed portion of the substrate 11 is etched to a depth of 2 µm. The trench 11a may have, for example, a width of 20 µm along the a-axis direction. The length of the trench 11a along the m-axis direction can be formed so as to extend from a front face, which emits light, to a rear face opposite. Note that the front face is the end face producing greater light output of the two resonator end faces, and the rear face is the end face opposite the front face, producing less light output than the front face.

The semiconductor-layer lamination 20 includes an n-type cladding layer 22, an n-type guide layer 24, an active layer 26, a p-type guide layer 28, an overflow layer 30, a p-type cladding layer 32, and a contact layer 34, formed in the order from the substrate 11 side. The n-type cladding layer 22 may be an n-type $Al_{0.03}Ga_{0.97}N$ layer having a thickness of 2 µm. The n-type guide layer 24 may be an n-type GaN layer having a thickness of 0.1 µm. The active layer 26 may be a quantum-well active layer formed of a lamination of three cycles of barrier layers made of $In_{0.02}Ga_{0.98}N$ and well layers made of $In_{0.06}Ga_{0.94}N$. The p-type guide layer 28 may be a p-type GaN layer having a thickness of 0.1 µm. The overflow layer (OFS layer) 30 may be an $Al_{0.20}Ga_{0.80}N$ layer having a thickness of 10 nm. The p-type cladding layer 32 may be a strained-layer superlattice having a thickness of 0.48 µm, formed of a lamination of 160 cycles of p-type $Al_{0.16}Ga_{0.84}N$ layers each having a thickness of 1.5 nm and GaN layers each having a thickness of 1.5 nm. The p-type cladding layer 32 has a part removed, and a strip-shaped ridge portion 20a extending in the m-axis direction is formed thereover, and the contact layer 34 is formed over the ridge portion 20a.

The semiconductor-layer lamination 20 can be formed by, for example, a metal-organic chemical vapor deposition (MOCVD) technique. For a material in a case using the MOCVD technique, for example, trimethylgallium (TMG) can be used as a material for Ga, trimethylindium (TMI) as a material for In, and trimethylalminum (TMA) as a material for Al; and ammonium ($NH_3$) can be used as a material for N. In addition, silane ($SiH_4$) gas can be used as a material for an n-type impurity of Si, and bis(cyclopentadienyl)magnesium ($Cp_2Mg$) can be used as a material for a p-type impurity of Mg. Moreover, instead of the MOCVD technique, a growth method by which a nitride semiconductor can be grown such as a molecular beam epitaxy (MBE) technique, a chemical beam epitaxy (CBE) technique, etc., may be used.

The semiconductor-layer lamination 20 includes a first region 20A formed over the trench 11a, and a second region 20B having a greater height than that of the first region 20A. A sloped portion whose height changes along the a-axis direction exists between the first region 20A and the second region 20B, and a planar region 20C having little height variation in the m-axis direction is formed in a portion including the sloped portion. Note that, although, in FIGS. 5A-5C, the borders between the first region 20A and the sloped portions are clearly illustrated, the first region 20A and the sloped portions may be integrated depending on the width of the trench 11a. In addition, although the second regions 20B are illustrated as planar regions, the second regions 20B have periodic surface undulations as described above. Moreover, although the planar regions 20C having a same size are formed on either side of the first region 20A in FIGS. 5A-5C, the sizes of the planar regions 20C may be different between on the left and the right sides of the first region 20A depending on the crystal orientation of the semiconductor-layer lamination 20. Furthermore, either or both of the planar regions 20C may include a portion other than the sloped portions. In addition, either or both of the second regions 20B may include a part of the sloped portions.

The ridge portion 20a is formed in the planar region 20C. The location to form the ridge portion 20a may be determined by the shape of the trench 11a, the direction of the trench, etc., as appropriate. However, since the slope in the a-axis direction becomes large if the ridge portion 20a is too close to the trench 11a, the distance between the end of the trench 11a and the center line of the ridge portion 20a is preferably about 1 µm, and more preferably, more than or equal to 2 µm. In addition, since planarization becomes insufficient if the distance from the end of the trench 11a is too large, the distance is preferably less than or equal to 15 µm, and more preferably, less than or equal to 10 µm. It is 5 µm in this embodiment.

The ridge portion 20a can be formed as follows. After the growth of the p-type contact layer 34 is completed, an $SiO_2$ film having a thickness of 0.3 µm is formed over the p-type contact layer 34. Then, a strip-shaped opening having a width of 1.5 µm is formed in the $SiO_2$ film by a lithography and an etching techniques. The opening is formed parallel to the m-axis. Following this, a part of the p-type contact layer 34 and a part of the p-type cladding layer 32 are removed using the $SiO_2$ film as a mask.

An insulating film (passivation film) 36 made of $SiO_2$ having a thickness of 200 nm is formed over the part except over the ridge portion 20a of the semiconductor-layer lamination 20. The insulating film 36 can be formed as follows. First, after forming the ridge portion 20a, an $SiO_2$ film is formed over the entire surface of the semiconductor-layer lamination 20 including the top surface of the ridge portion 20a by a thermal CVD technique etc. Next, a resist pattern with an opening having a width of 1.3 µm is formed over the top surface of the ridge portion 20a. Following this, the $SiO_2$ film is selectively etched to expose the contact layer 34 by reactive ion etching (RIE) using methane trifluoride ($CHF_3$) gas with the resist pattern as a mask.

Over the ridge portion 20a, a p-side electrode 38 formed of a palladium (Pd) layer having a thickness of 40 nm and a platinum (Pt) layer having a thickness of 35 nm is formed in contact with the contact layer 34. The p-side electrode 38 can be formed by an electron-beam (EB) evaporation technique and a lift-off technique.

A pad electrode 40, which is a lamination including a titanium (Ti) layer, a platinum (Pt) layer, and a gold (Au) layer respectively having thicknesses of 50 nm, 200 nm, and 10 µm, is formed over the p-side electrode 38. If a wiring electrode intersects a cleavage line when the resonator is cleaved, the p-side electrode and the contact layer in close contact with the wiring electrode may delaminate. Therefore, it is preferable that the pad electrode 40 be formed spaced apart from the end and the side faces of the resonator; it is suggested that, for example, the length along the direction parallel to the ridge portion 20a be 500 µm, and the width along the direction transverse to the ridge portion 20a be 150 µm. The pad electrode 40 can be formed by firstly forming a laminated film of a titanium (Ti) layer, a platinum (Pt) layer, and a gold (Au) layer respectively having thicknesses of 50 nm, 200 nm, and 100 nm using an EB evaporation technique and a lift-off technique, and then by increasing the thickness of the Au layer to approximately 10 µm by an electrolytic plating technique. An increase of the thickness of the Au layer allows mounting of a laser chip by wire bonding, and allows the reliability of a semiconductor laser device to be improved since the heat generated in the active layer 26 can be effectively dissipated.

An n-side electrode 42, which is a lamination including a Ti layer having a thickness of 5 nm, a platinum layer having a thickness of 10 nm, and a Au layer having a thickness of 1000 nm, is formed over a surface (rear surface) of the substrate 11 opposite the semiconductor-layer lamination 20. The n-side electrode 42 can be formed after the pad electrode 40 is formed, by polishing the substrate 11 with diamond slurry from the rear surface to reduce the thickness of the substrate 11 to approximately 100 µm, and then performing an EB evaporation process.

In this embodiment, a primary cleavage is performed along the m-plane so that the length in the m-axis direction will be 600 µm. In addition, a secondary cleavage is performed along the a-plane so that the length in the a-axis direction will be 200 µm.

In this embodiment, the planar region 20C having little height variation in the direction parallel to the trench 11a is formed laterally adjacent to the trench 11a by forming the semiconductor-layer lamination 20 over the substrate 11 having the trench 11a. Formation of the strip-shaped ridge portion 20a in the planar region 20C allows the planarity of the optical waveguide to be improved. This achieves a semiconductor laser device exhibiting a single-peaked FFP shape. Although the RMS of the planar region 20C is preferred to be less than or equal to 10 nm, a semiconductor laser device exhibiting a single-peaked FFP shape can be achieved with the RMS less than or equal to 20 nm.

An optical waveguide generally means the entire region where laser light is distributed. For example, in a laser device having a ridge strip structure, an optical waveguide includes not only the ridge portion, but also a region laterally adjacent to the ridge portion where laser light is distributed. However, improvement of the FFP shape of a semiconductor laser device and improvement of the uniformity of the bandgap energy of the active layer does not necessarily require that the entire optical waveguide be formed in a planar region having a high planarity. Therefore, at least in a semiconductor laser device having a ridge strip structure, forming the ridge portion in a planar region is sufficient.

Figure 6:
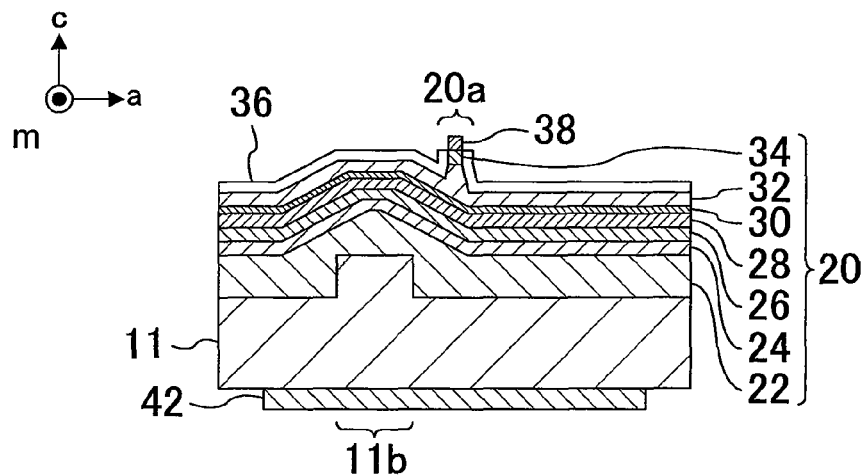
FIG. 6 is a cross-sectional view illustrating a variation of a semiconductor laser device according to one embodiment.

In order to form the semiconductor-layer lamination 20 having the planar region 20C, it is not necessarily required that the trench 11a be formed on the substrate 11, but it is sufficient that two sections having different heights from each other be formed. For example, if a strip-shaped projection 11b is formed instead of the trench 11a as shown in FIG. 6, the planar region 20C can be formed laterally adjacent to the projection 11b.

The substrate 11 having the projection 11b can be formed as follows. First, for example, $SiO_2$ is deposited to a thickness of 600 nm by a thermal CVD technique using $SiH_4$ as a material over the n-type hexagonal GaN substrate 11 whose principal plane is the plane (0001). Then, a strip-shaped portion is removed from the mask film in the m-axis direction by a lithography and an etching techniques so that the length in the a-axis direction will be 20 µm. Next, by an ICP etching tool using $CF_4$ as the etching gas, the top portion of the substrate 11 where the mask film is formed is etched. This allows the projection 11b having a height of 2 μm to be formed over the substrate 11.

Figure 7:
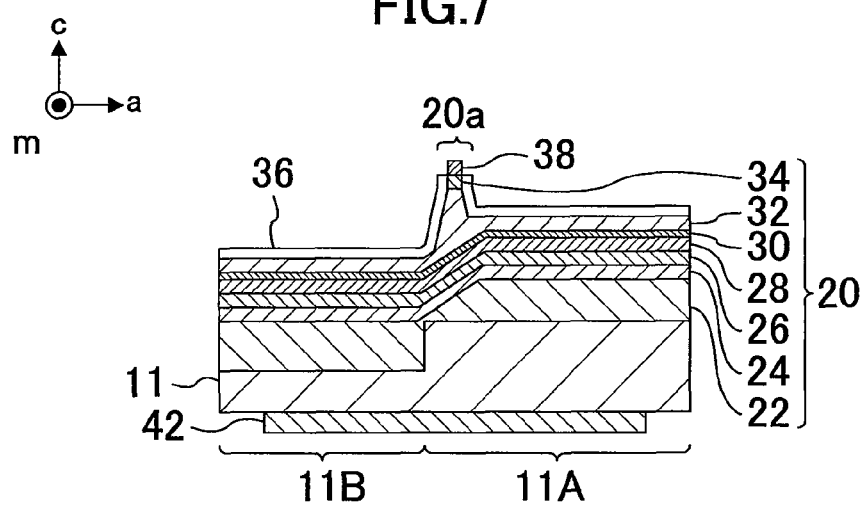
FIG. 7 is a cross-sectional view illustrating another variation of the semiconductor laser device according to one embodiment.
Figure 8:
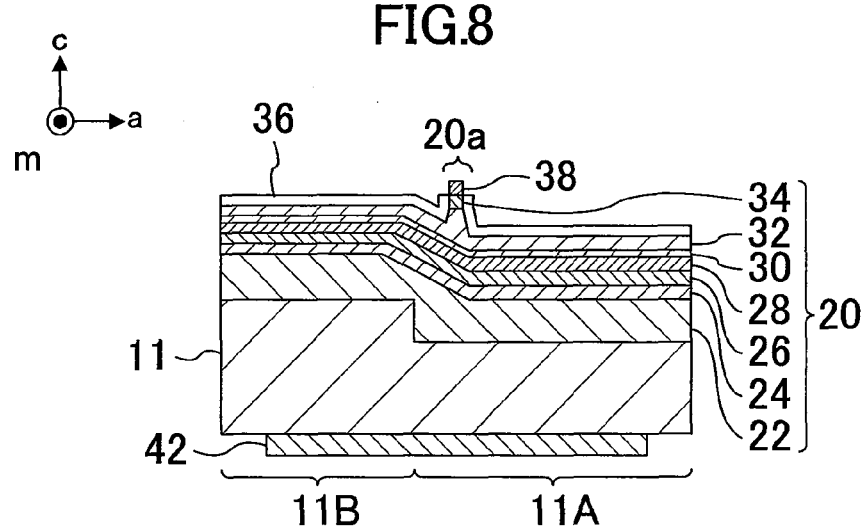
FIG. 8 is a cross-sectional view illustrating still another variation of the semiconductor laser device according to one embodiment.

Although the widths of the trench 11a and the projection 11b are both approximately 20 μm, a width more than or equal to 2 μm is sufficient. Since a larger width creates difficulties in the formation thereof, the width may be less than or equal to 200 μm, and preferably, be less than or equal to 100 μm. However, since larger volumes of the trench 11a and the projection 11b are advantageous in that the formation of the planar region 20C becomes easier, the widths of the trench 11a and the projection 11b may be even larger. Eventually, the trench or the projection may be extended to form the semiconductor-layer lamination 20 over a substrate 11 having a first section 11A and a second section 11B whose heights are different from each other as shown in FIG. 7 or FIG. 8.

It is suggested that the trench 11a and the projection 11b be formed from the front face to the rear face. However, it would pose no problems even if a portion where the trench 11a or the projection 11b is not formed exists in the vicinities of the front face and the rear face.

It is sufficient that the depth of the trench 11a and the height of the projection 11b be more than or equal to approximately 0.1 μm. Since a larger depth of the trench 11a and a larger height of the projection 11b creates difficulties in the formation thereof, the depth and the height are preferable to be less than or equal to 10 μm.

In addition, instead of forming the semiconductor-layer lamination over a substrate having a trench or a projection, a method may be such that after a part of the semiconductor-layer lamination is formed over a planar substrate, a trench or a projection is formed on the semiconductor-layer lamination, and then the semiconductor-layer lamination is regrown. In this case, it is suggested that after at least one semiconductor layer is formed over the substrate, a trench or a projection is formed by etching etc., and then one or more semiconductor layers including an active layer are formed by regrowth. A depth of the trench or a height of the projection of more than or equal to 0.01 μm is sufficient. In addition, since a fairly large height difference is difficult to be formed, it is preferable that the depth of the trench or the height of the projection be less than or equal to 5 μm.

In this embodiment, an example has been described in which the principal plane of the substrate is the c-plane, and the optical waveguide is formed along the m-axis direction. However, a semiconductor-layer lamination may be formed over a substrate having another plane orientation. Moreover, the direction of the optical waveguide may coincide with another orientation.

Furthermore, although the substrate has been described as a GaN-based substrate (GaN substrate, AlGaN substrate, etc.) of hexagonal system, another substrate on which a GaN-based material can grow, such as silicon carbide (SiC), silicon (Si), sapphire (monocrystal $Al_2O_3$), zinc oxide (ZiO), etc., may be used.

In this embodiment, the description above has been presented in terms of a ridge-strip semiconductor laser device having a ridge portion. However, a similar advantage can be realized by a buried semiconductor laser device. In this case, an opening of a current-blocking layer should be located in a planar region. This allows the optical waveguide to be formed in the planar region.

INDUSTRIAL APPLICABILITY

The example semiconductor laser device can achieve a semiconductor laser device having a planarized optical waveguide and an active layer whose bandgap energy is uniform without control of the off-angle of the substrate, and is useful for a nitride semiconductor laser device, particularly, a nitride semiconductor laser device used for, for example, laser displays, backlights in liquid crystal displays, etc.

DESCRIPTION OF REFERENCE CHARACTERS

11 Substrate
11A First Section
11B Second Section
11a Trench
11b Projection
20 Semiconductor-Layer Lamination
20A First Region
20B Second Region
20C Planar Region
20a Ridge Portion
22 N-Type Cladding Layer
24 N-Type Guide Layer
26 Active Layer
28 P-Type Guide Layer
30 Overflow Layer
32 P-Type Cladding Layer
34 Contact Layer
36 Insulating Film
38 P-Side Electrode
40 Pad Electrode
42 N-Side Electrode
102 Trench
104 Nitride Semiconductor Layer
105 Planar Region

The invention claimed is:

1. A semiconductor laser device, comprising:
a substrate of GaN having a stepped region made of GaN along an m-axis direction, the stepped region being formed in a semiconductor layer; and
a semiconductor-layer lamination having an active layer formed over the substrate, wherein
the semiconductor-layer lamination has a first region, a second region, and a planar region between the first region and the second region along an a-axis direction,
a height of the first region and a height of the second region are different from each other,
the planar region is formed laterally adjacent to the stepped region, and
an optical waveguide is formed on the planar region along the m-axis direction,
wherein the substrate has a principal plane which is the plane (0001) (C), and
an angle between a plane of the planar region and the principal plane of the substrate is about 0.3°.

2. The semiconductor laser device of claim 1, wherein
the semiconductor-layer lamination includes a strip-shaped ridge portion, and
the ridge portion is formed in the planar region.

3. The semiconductor laser device of claim 2, wherein the substrate includes two sections having top surfaces whose heights are different from each other, and
a distance from the center of the ridge portion to the border of the two sections is greater than or equal to 1 μm and less than or equal to 15 μM.

4. The semiconductor laser device of claim 2, wherein
a portion in the active layer formed under the ridge portion has a variation in the bandgap energy smaller than that of the other part of the active layer.

5. The semiconductor laser device of claim 1, wherein a top surface of a region where the optical waveguide is formed in the semiconductor-layer lamination has a root-mean-square roughness less than or equal to 20 nm.

6. The semiconductor laser device of claim 1, wherein the semiconductor-layer lamination is made of nitride semiconductor, and
the optical waveguide is formed in a direction along an m-axis of the nitride semiconductor.

7. The semiconductor laser device of claim 1, wherein the active layer contains indium.

8. The semiconductor laser device of claim 1, wherein the semiconductor-layer lamination includes a front face which emits light, and
the planar region is formed continuously from the front face to a rear face opposite the front face.

9. The semiconductor laser device of claim 8, wherein the front face is the plane (1-100) (M), and a direction of the optical waveguide is the <1-100> direction.

10. The semiconductor laser device of claim 1, wherein the height of the first region and the height of the second region change along the a-axis direction.

11. The semiconductor laser device of claim 1, wherein the planar region has periodic surface undulations whose variation is smaller than that of the second region.

12. The semiconductor laser device of claim 1, wherein the stepped region includes at least one of a trench and a projection.

13. The semiconductor laser device of claim 1, wherein the stepped region is formed in a single semiconductor layer.

14. The semiconductor laser device of claim 1, wherein the stepped region includes two sections of the substrate having top surfaces whose heights are different from each other.

* * * * *